(12) United States Patent
Takahashi et al.

(10) Patent No.: US 11,729,956 B2
(45) Date of Patent: Aug. 15, 2023

(54) COOLING SYSTEM FOR POWER CONVERSION DEVICE

(71) Applicants: NISSAN MOTOR CO., LTD., Yokohama (JP); RENAULT S.A.S., Boulogne-Billancourt (FR)

(72) Inventors: Naoki Takahashi, Kanagawa (JP); Yukinori Tsukamoto, Kanagawa (JP)

(73) Assignees: NISSAN MOTOR CO., LTD., Yokohama (JP); RENAULT S.A.S., Boulogne-Billancourt (FR)

( * ) Notice: Subject to any disclaimer, the term of this patent is extended or adjusted under 35 U.S.C. 154(b) by 121 days.

(21) Appl. No.: 17/265,575

(22) PCT Filed: Aug. 9, 2018

(86) PCT No.: PCT/IB2018/001045
§ 371 (c)(1),
(2) Date: Feb. 3, 2021

(87) PCT Pub. No.: WO2020/030939
PCT Pub. Date: Feb. 13, 2020

(65) Prior Publication Data
US 2021/0243922 A1   Aug. 5, 2021

(51) Int. Cl.
*H05K 7/20* (2006.01)
(52) U.S. Cl.
CPC ..... *H05K 7/20927* (2013.01); *H05K 7/20909* (2013.01); *H05K 7/20945* (2013.01)

(58) Field of Classification Search
CPC .......... H05K 7/20927; H05K 7/20909; H05K 7/20945; H05K 7/20872
See application file for complete search history.

(56) References Cited

U.S. PATENT DOCUMENTS

| | | | |
|---|---|---|---|
| 6,467,286 B2 * | 10/2002 | Hasebe | H01M 10/613 165/41 |
| 6,889,516 B2 * | 5/2005 | Sasaki | H02K 9/04 62/230 |
| 2003/0067749 A1 | 4/2003 | Tamba et al. | |
| | (Continued) | | |

FOREIGN PATENT DOCUMENTS

| | | | | |
|---|---|---|---|---|
| EP | 0794 098 | * | 9/1997 | B61C 17/04 |
| JP | 3676719 B2 | | 7/2005 | |
| | (Continued) | | | |

*Primary Examiner* — Mukundbhai G Patel
(74) *Attorney, Agent, or Firm* — Foley & Lardner LLP

(57) ABSTRACT

Provided is a cooling system for a power conversion device that includes a radiator, a radiator fan supplying air to the radiator, and a power conversion device including a plurality of electric components and a casing housing the plurality of electric components inside. The casing includes a base portion which is formed of a non-metallic material and on which the plurality of electric components is placed and a cover portion formed of a metallic material, fixed to the base portion, and covering a periphery of the plurality of electric components. A refrigerant channel through which a refrigerant cooling the plurality of electric components flows is formed in the base portion of the casing, and the casing is disposed at a position where an airflow of the radiator fan is applied to the cover portion.

8 Claims, 5 Drawing Sheets

(56) References Cited

U.S. PATENT DOCUMENTS

| | | | |
|---|---|---|---|
| 2005/0002162 A1* | 1/2005 | Beihoff | H02M 7/003 |
| | | | 361/689 |
| 2014/0084719 A1 | 3/2014 | Asakura et al. | |
| 2019/0195212 A1 | 6/2019 | Sasaki et al. | |

FOREIGN PATENT DOCUMENTS

| | | | | |
|---|---|---|---|---|
| JP | 2006-264473 A | 10/2006 | | |
| JP | 2012-170177 A | 9/2012 | | |
| JP | 2013-128051 A | 6/2013 | | |
| JP | 2017-103944 A | 6/2017 | | |
| JP | 2018019551 | * 2/2018 | | Y02T 10/64 |
| JP | 2018-114833 A | 7/2018 | | |
| WO | WO-2018/088525 A1 | 5/2018 | | |

\* cited by examiner

COOLING SYSTEM FOR POWER CONVERSION DEVICE

TECHNICAL FIELD

The present invention relates to a cooling system for a power conversion device.

BACKGROUND ART

Conventionally, there is known a cooling structure for a power conversion device mounted in a vehicle or the like in which a cooling water path is provided in a casing housing the power conversion device. In JP 3676719 B2, a cooling water path is provided in a casing formed by aluminum die casting to cool the casing and a power module of a power conversion device housed in the casing.

SUMMARY OF INVENTION

However, the cooling structure for the power conversion device described above has a problem that the casing is entirely formed of a metal, and therefore a power conversion device unit including the casing is heavy. Moreover, when a cooling water path of a complicated structure is provided, processing is required after the casing is formed by die casting, which also poses problems that processing is difficult to perform and the number of processes increases.

In order to solve the above-described problems, it is considered to form the casing of a resin material lighter than the metal and easy to process. However, when the casing is formed of the resin material, a cooling effect obtained by the cooling water path is not transferred to the entire casing because the resin material has high heat resistance, which poses a risk of increasing the casing temperature in a part distant from a part where the cooling water path is provided. When the temperature of the casing increases, electric components or elements on a substrate configuring the power conversion device inside the casing are heated by the heat of the casing, which poses a problem that the power conversion device is not sufficiently cooled even by the cooling water path.

In view of the above-described problems, it is an object of the present invention to provide a cooling system for a power conversion device which enables sufficient cooling, is easy to process, and is lightweight.

According to an aspect of this invention, there is provided a cooling system for a power conversion device that includes a radiator, a radiator fan supplying air to the radiator, and a power conversion device including a plurality of electric components and a casing housing the plurality of electric components inside. The casing includes a base portion which is formed of a non-metallic material and on which the plurality of electric components is placed and a cover portion formed of a metallic material, fixed to the base portion, and covering a periphery of the plurality of electric components. A refrigerant channel through which a refrigerant cooling the plurality of electric components flows is formed in the base portion of the casing, and the casing is disposed at a position where an airflow of the radiator fan is applied to the cover portion.

DESCRIPTION OF EMBODIMENTS

Hereinafter, embodiments of the present invention are described with reference to the drawings, for example.

First Embodiment

Figure 1:
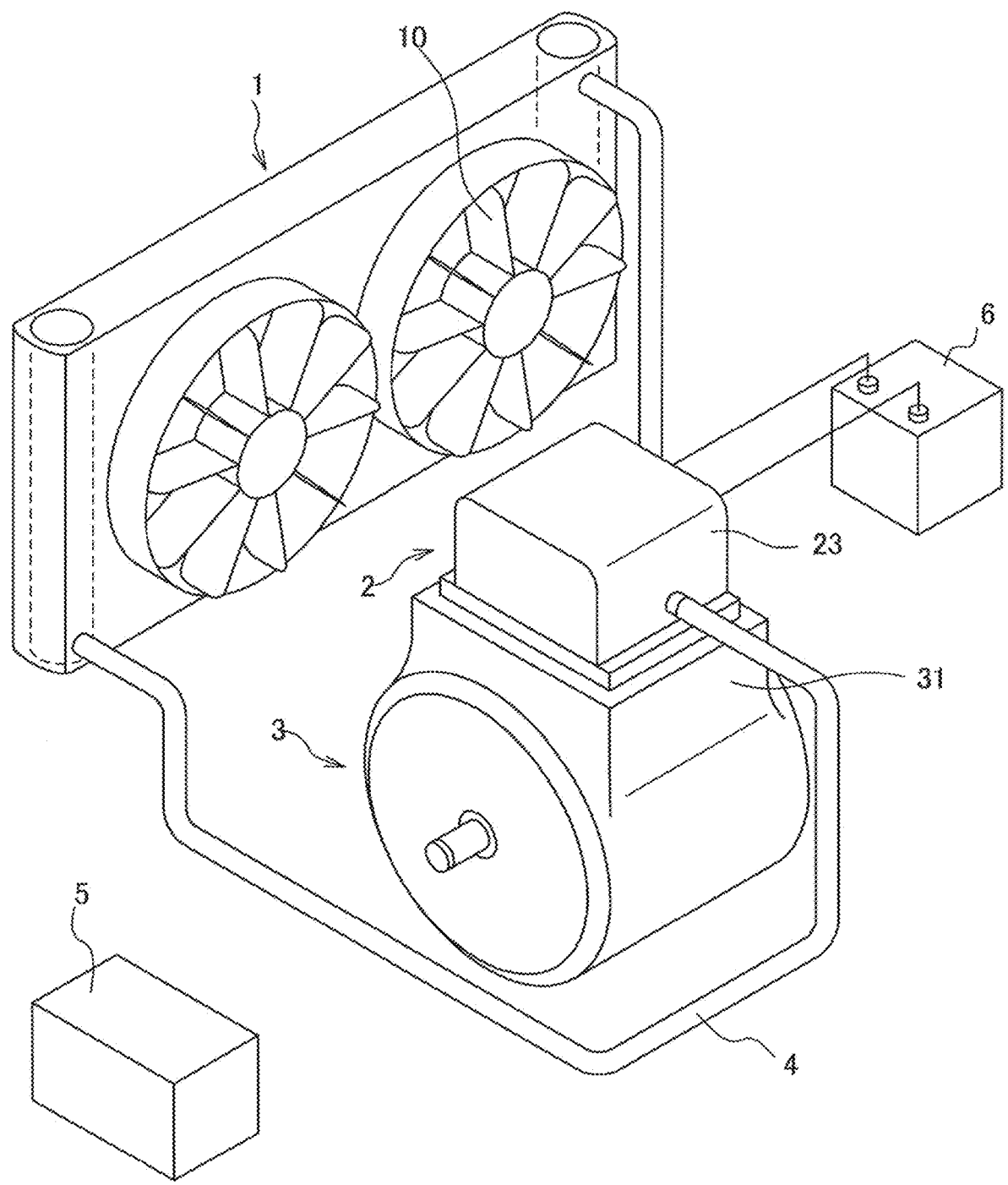
FIG. 1 is a schematic block diagram illustrating a cooling system for a power conversion device according to a first embodiment.

FIG. 1 is a schematic block diagram illustrating a cooling system for a power conversion device according to a first embodiment.

As illustrated in FIG. 1, the cooling system for the power conversion device includes a radiator 1, a radiator fan 10, an inverter 2, a motor 3, a cooling water passage 4, a control unit 5, and a battery 6, and these components are mounted in a vehicle or the like.

The radiator 1 is provided on the cooling water passage 4 connected to a cooling water path 21 inside the inverter 2 described later and cools cooling water flowing through the cooling water passage 4 by heat exchange or the like. The radiator fan 10 is installed in front of the radiator 1.

The cooling water passage 4 is a passage connecting the outlet and the inlet of the cooling water path 21 (see FIG. 2) inside the inverter 2 and is connected from the outlet of the cooling water path 21 to the inlet of the cooling water path 21 through the radiator 1 and a motor cooling path (not illustrated) inside the motor 3.

The radiator fan 10 is an electric fan which is installed in front of the radiator 1 and the rotational speed of which is controlled by the control unit 5. By the rotation of the radiator fan 10, air (cooling air) is sucked into the radiator 1, so that the radiator 1 is cooled. By cooling the radiator 1 with the radiator fan 10 as described above, the cooling water in the radiator 1 is heat-exchanged to be cooled.

The inverter 2 is a power conversion device converting power between the battery 6 and the motor 3 and includes a plurality of electric components 22 (see FIG. 2) and a casing 23 housing the electric components 22 inside. The inverter 2 is disposed at a position where an airflow of the radiator fan 10 is applied, preferably near the radiator 1, to face the front surface of the radiator fan 10. Inside the casing 23, a temperature sensor as a temperature acquisition means is provided. The detected temperature is transmitted to the control unit 5.

The motor 3 functions as an electric motor rotating by receiving the supply of power through the inverter 2 from a power source, such as the battery 6, to drive wheels of a vehicle. Moreover, the motor 3 functions also as a dynamo driven by external force to generate electricity. Therefore, the motor 3 is configured as a so-called rotary electric machine (motor generator) functioning as an electric motor and a dynamo.

The motor 3 includes a rotor and a stator which are not illustrated and a case 31 housing the rotor and the stator. The case 31 of the motor 3 and the casing 23 of the inverter 2 are fastened to each other by a fastening member, such as a bolt. The rotor or the stator configuring the motor 3 is provided with a thermocouple as a temperature acquisition means. The measured temperature is transmitted to the control unit 5.

The control unit 5 includes a general-purpose electronic circuit including a microcomputer, a microprocessor, and a CPU and peripheral devices and performs processing for specific control by executing specific programs. For example, the control unit 5 controls the rotational speed of the radiator fan 10 described later.

Figure 2:
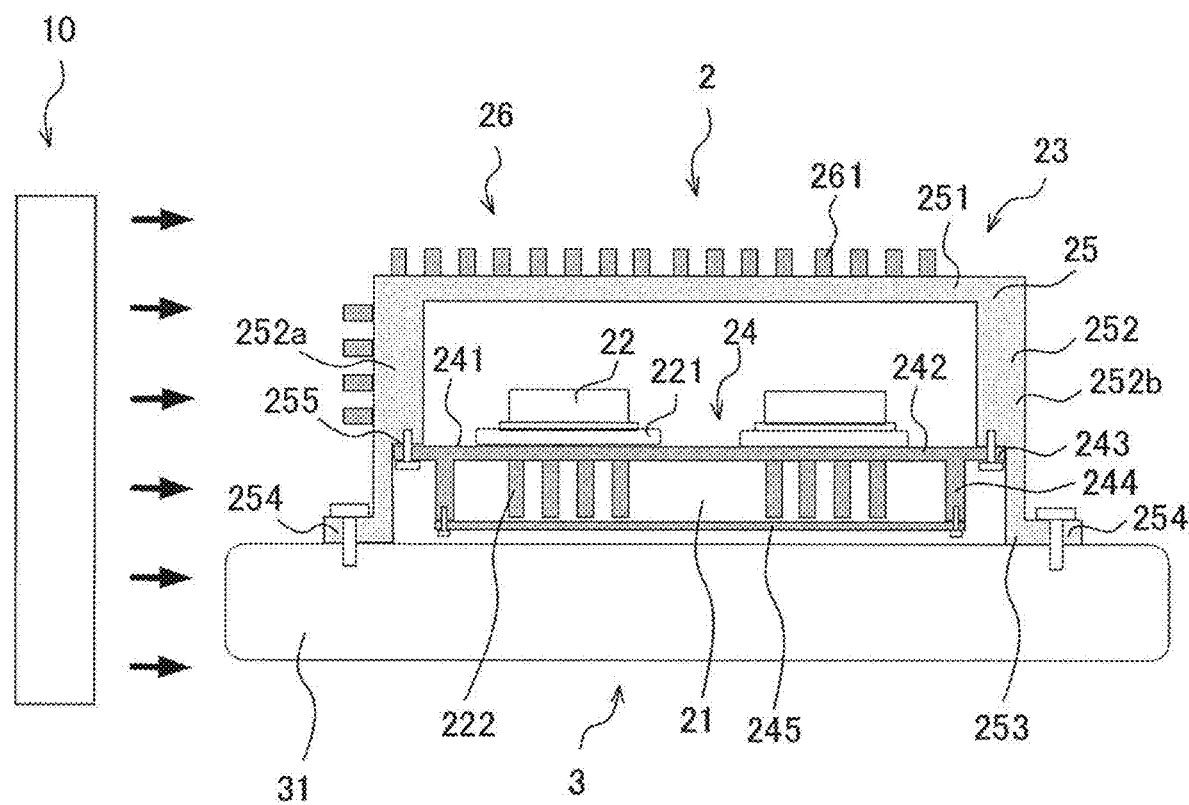
FIG. 2 is a cross-sectional view of the power conversion device.

FIG. 2 is a cross-sectional view of the inverter 2. As illustrated in FIG. 2, the inverter 2 includes the plurality of electric components 22, such as a switching element and a diode, and the casing 23 housing these electric components 22.

The casing 23 includes a base portion 24 where the electric components 22 are placed and a cover portion 25 fixed to the base portion 24 and covering the periphery of the electric components 22.

The base portion 24 is a member formed of insulating non-metallic materials, such as a resin, for example and mounting the electric components 22. In a lower portion of the base portion 24, the cooling water path 21 through which cooling water for cooling the electric components 22 flows is provided. The base portion 24 includes an upper portion 242 on a placement surface 241 of which the electric components 22 are mounted, a side portion 244 extended downward from an outer edge portion 243 of the base portion 24, and a bottom plate portion 245 in which the upper surface of the outer peripheral edge abuts on the tip surface of the side portion 244. The side portion 244 and the bottom plate portion 245 are fastened to each other by bolts or the like from the bottom plate portion 245 side in the abutment portion to form the cooling water path 21 surrounded by the upper portion 242, the side portion 244, and the bottom plate portion 245 inside the base portion 24. The base portion 24 is fastened to the cover portion 25 of the casing 23 described later in the outer edge portion 243.

The plurality of electric components 22 is mounted on the placement surface 241 of the upper portion 242 of the base portion 24 through a substrate 221. The electric components 22 are fixed to the substrate 221 and the base portion 24 by bolts or the like. Fins 222 are provided under the electric components 22. The substrate 221 and the base portion 24 are provided with holes for passing the fins 222. The fins 222 contact the cooling water in the cooling water path 21 through the holes. It is preferable that the electric components 22 are provided with the fins 222 to be brought into contact with the cooling water. However, the present invention is not necessarily limited thereto and the fin 222 may not be provided. In this embodiment, one substrate 221 is used for each electric component 22 but the plurality of electric components 22 may be placed on one substrate.

The outlet of the cooling water path 21 is connected to the cooling water passage 4 on the downstream side of the radiator 1 through the motor cooling path inside the motor 3. The inlet of the cooling water path 21 is connected to the cooling water passage 4 on the upstream side of the radiator 1. The cooling water flowing through the cooling water path 21 and the cooling water passage 4 cools the motor 3 and the inverter 2, and then is cooled by the radiator 1 provided on the cooling water passage 4. The cooling water cooled by the radiator 1 flows into the cooling water path 21 in the inverter 2 again through the motor cooling path from the cooling water passage 4. Herein, it does not matter which of the motor 3 or the inverter 2 is first cooled. Thus, the cooling water in the cooling water path 21 is circulated through the cooling water passage 4 outside the inverter 2. On the back side of a portion where the electric components 22 are placed of the base portion 24, a temperature sensor as a temperature acquisition means of the cooling water is provided. The detected temperature is transmitted to the control unit 5.

The cover portion 25 is formed of metallic materials, such as aluminum, for example, and covers the periphery of the electric components 22. The cover portion 25 includes an upper wall 251, a side wall 252, and outer edge portions 254 extended outward from tip portions 253 of the side wall 252.

In an inner part of the side wall 252 of the cover portion 25, a step portion 255 having an end surface abutting on the placement surface 241 of the base portion 24 is formed. In the tip portions 253 of the side wall 252, the outer edge portions 254 of a flange shape are formed and the bottom surfaces (tip surfaces of the side wall 252) of the outer edge portions 254 abut on the case 31 of the motor 3. The end surface of the step portion 255 and the placement surface 241 of the base portion 24 are fastened to each other by bolts or the like from the lower side of the base portion 24. The bottom surfaces (tip surfaces of the side wall 252) of the outer edge portions 254 and the case 31 of the motor 3 are fastened to each other by bolts or the like from the upper side of the outer edge portions 254. In order to increase the electromagnetic shield property of the casing 23, a metal thin plate containing aluminum or the like larger than the outer shape of the bottom plate portion 245 may be provided under the bottom plate portion 245 of the base portion 24 and the outer peripheral edge of the metal thin plate may be interposed between the outer edge portions 254 of the cover portion 25 and the case 31 of the motor 3. In this case, the outer edge portions 254 of the cover portion 25, the outer peripheral edge of the metal thin plate, and the case 31 of the motor 3 are fastened together by bolts or the like, for example. The cover portion 25 and the metal thin plate, and the cover portion 25 and the case 31 of the motor 3 may be independently fastened to each other, for example.

A component to which the tip surfaces (bottom surfaces of the outer edge portions 254) of the side wall 252 are fastened is not limited to the motor 3 and may be a decelerator or the like, for example.

The inverter 2 is disposed at a position where cooling air from the radiator fan 10 is blown and applied. On the upper wall 251 and a side wall 252a on a side facing the radiator fan 10 of the cover portion 25, a heat sink 26 including a plurality of radiating fins 261 is projectingly provided. The radiating fins 261 are provided in a rib shape to project to the outside of the casing 23 from the cover portion 25. Thus, the casing 23 is efficiently cooled by the airflow from the radiator fan 10. Although this embodiment is configured so that the radiating fins 261 are provided on the upper wall 251 and the side wall 252a on the side facing the radiator fan 10 of the cover portion 25 and the radiating fins 261 are not provided on a side wall 252b on a side opposite to the side wall 252a, positions where the radiating fins 261 are provided are not limited thereto. For example, the radiating fins 261 may be provided on the entire outer surface of the cover portion 25 or may be provided only at a position where the airflow of the radiator fan 10 is applied. The shape of the radiating fins 261 is not limited to the rib shape and may be a pin shape, a lattice shape, or the like, for example.

Figure 3:
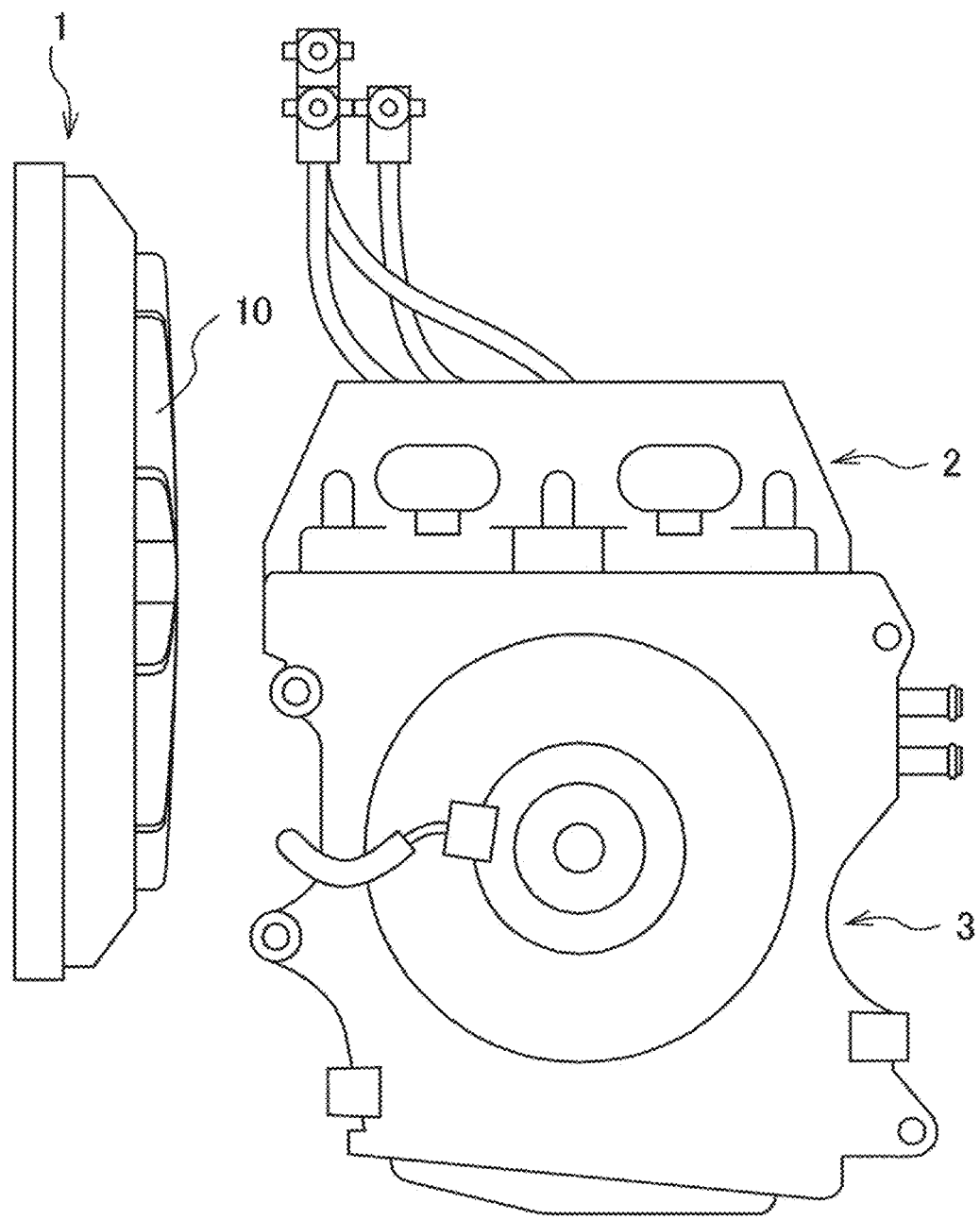
FIG. 3 is a figure illustrating the positional relationship of a radiator fan, an inverter, and a motor.

The inverter 2 and the motor 3 are preferably disposed such that the fastening position of the casing 23 of the inverter 2 and the case 31 of the motor 3 is located at the same height as the height of the center position in the height direction of the radiator fan 10 as illustrated in FIG. 3. Thus, the cooling air from the radiator fan 10 is blown and applied to the inverter 2 and the motor 3, so that both the inverter 2 and the motor 3 can be efficiently cooled by the airflow of the radiator fan 10.

It is preferable that projections, such as a connector, are disposed on the surface not facing the radiator fan 10 of the casing 23 of the inverter 2 and the projections, such as a connector, are not disposed on the side wall 252a on the side facing the radiator fan 10 of the casing 23 of the inverter 2. Thus, the airflow of the radiator fan 10 is efficiently blown and applied to the inverter 2 without being blocked by the connector or the like and the distance between the radiator fan 10 and the inverter 2 can be further shortened.

When the inverter 2 is mounted in a vehicle or the like, it is necessary to secure sufficient strength against a collision or vibration. In the case of a configuration in which the cooling water path 21 formed of a resin is covered with a casing formed of a metal in order to secure the strength of the inverter 2, processing of the cooling water path 21 is facilitated but the weight cannot be reduced. In order to address the problem, it is considered to secure the strength by fastening the cover portion 25 of the casing 23 to a component, such as the motor 3, having rigidity higher than that of a resin without covering the cooling water path 21 formed of a resin with a metal. However, when the temperature of the motor 3 which is a fastening target of the cover portion 25 becomes high, heat of the motor 3 is transferred to the cover portion 25 formed of a metal through a fastening member, such as a bolt. On the other hand, the cooling water path 21 is formed of a resin having heat resistance higher than that of a metal, and therefore the cooling effect obtained by the cooling water path 21 is not transferred to the cover portion 25, so that the cover portion 25 cannot be sufficiently cooled. Hence, there is a risk that the electric components 22 inside the casing 23 are heated by the heat of the motor 3 transferred to the cover portion 25.

In this embodiment, while the strength of the inverter 2 is secured by fastening the tip surfaces of the side wall 252 of the cover portion 25 to the case 31 of the motor 3 having rigidity higher than that of a resin and the like, the cover portion 25 can be cooled by disposing the casing 23 at the position where the airflow from the radiator fan 10 is applied to the cover portion 25 even when the cooling effect obtained by the cooling water path 21 is not transferred to the cover portion 25. Therefore, the inverter 2 can be sufficiently cooled while securing the strength of the inverter 2.

Figure 4:
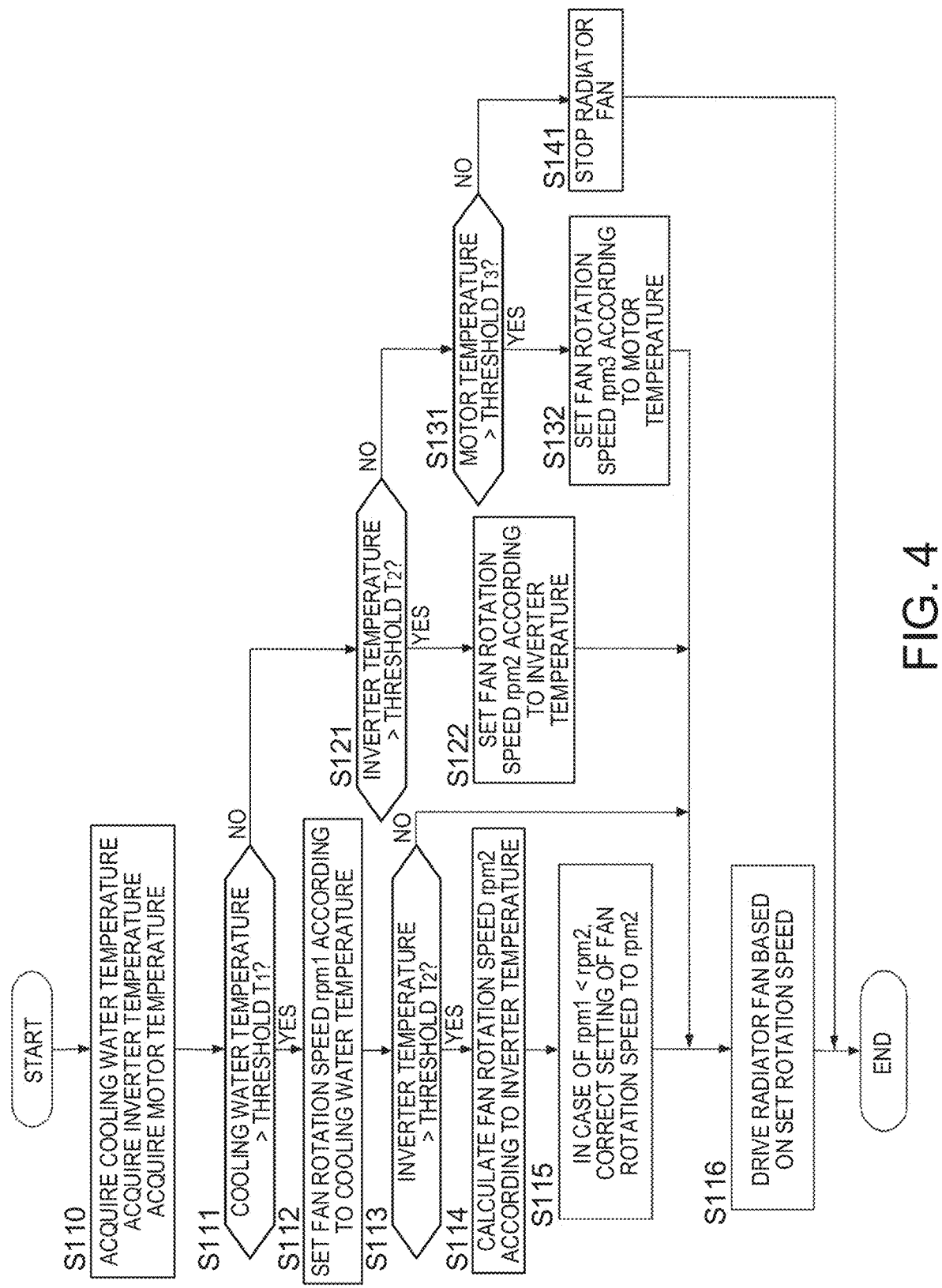
FIG. 4 is a flow chart explaining cooling control of the power conversion device.

FIG. 4 is a flow chart explaining the cooling control of the power conversion device in this embodiment. The following control is carried out by the control unit 5 at every predetermined time.

In Step S110, the control unit 5 receives the cooling water temperature of the back side of the portion where the electric components 22 are placed of the base portion 24 (cooling water temperature), the temperature in the casing 23 of the inverter 2 (inverter temperature), and the temperature of the rotor or the stator of the motor 3 (motor temperature). The cooling water temperature is the temperature in the cooling water path 21 detected by the temperature sensor provided on the back side of the portion where the electric components 22 are placed of the base portion 24. The inverter temperature is the temperature detected by the temperature sensor provided inside the casing 23. The motor temperature is the temperature measured by the thermocouple provided in the rotor or the stator configuring the motor 3.

In Step S111, the control unit 5 determines whether the cooling water temperature acquired in Step S110 is higher than a predetermined threshold $T_1$. The predetermined threshold $T_1$ is determined beforehand by an experiment or the like and set as a temperature enabling the cooling of the inverter 2. When the cooling water temperature is higher than the threshold $T_1$, the control unit 5 carries out processing of Step S112.

In Step S112, the control unit 5 sets a rotation speed rpm1 of the radiator fan 10 according to the cooling water temperature acquired in Step S110. The rotation speed rpm1 of the radiator fan 10 is set based on a rotation speed required for reducing the cooling water temperature to be equal to or less than the threshold $T_1$, the rotation speed being acquired beforehand by an experiment or the like. The rotation speed rpm1 becomes larger with an increase in the detected cooling water temperature.

Subsequently, in Step S113, the control unit 5 determines whether the inverter temperature acquired in Step S110 is higher than a predetermined threshold $T_2$. The threshold $T_2$ is determined beforehand by an experiment or the like and set as a temperature not affecting an operation of the inverter 2. When the inverter temperature is higher than the threshold $T_2$, the control unit 5 carries out processing of Step S114 in order to calculate a rotation speed required for reducing the inverter temperature to be equal to or less than the threshold $T_2$. On the other hand, when the inverter temperature is equal to or less than the threshold $T_2$, the control unit 5 carries out processing of Step S116 in order to drive the radiator fan 10 based on the rotation speed rpm1 set in Step S112.

In Step S114, the control unit 5 calculates a rotation speed rpm2 of the radiator fan 10 according to the inverter temperature acquired in Step S110. The rotation speed rpm2 of the radiator fan 10 is calculated based on the rotation speed required for reducing the inverter temperature to be equal to or less than the threshold $T_2$, the rotation speed being acquired beforehand by an experiment or the like. The rotation speed rpm2 becomes larger with an increase in the detected inverter temperature.

Subsequently, in Step S115, the control unit 5 compares the rotation speed rpm1 of the radiator fan 10 set according to the cooling water temperature in Step S112 with the rotation speed rpm2 of the radiator fan 10 calculated in Step S114. As a result, when the rotation speed rpm2 calculated in Step S114 is larger, the rotation speed rpm1 set in Step S112 is corrected to the rotation speed rpm2 calculated in Step S114 and set as the rotation speed of the radiator fan 10. On the other hand, when the rotation speed rpm1 set in Step S112 is larger, the control unit 5 carries out processing of Step S116 without performing the correction.

In Step S116, the control unit 5 drives the radiator fan 10 based on the set rotation speed of the radiator fan 10.

On the other hand, in Step S111, when it is determined that the cooling water temperature acquired in Step S110 is equal to or less than the predetermined threshold $T_1$, the control unit 5 carries out processing of Step S121 in order to determine the inverter temperature.

In Step S121, the control unit 5 determines whether the inverter temperature acquired in Step S110 is higher than the predetermined threshold $T_2$ as with Step S113. When the inverter temperature is higher than the threshold $T_2$, the control unit 5 carries out processing of Step S122 in order to set the rotation speed of the radiator fan 10 to the rotation speed required for reducing the inverter temperature to be equal to or less than the threshold $T_2$.

In Step S122, the control unit 5 sets the rotation speed rpm2 of the radiator fan 10 according to the inverter temperature acquired in Step S110. Then, the control unit 5 carries out processing of Step S116 in order to drive the radiator fan 10 based on the set rotation speed rpm2. The rotation speed rpm2 of the radiator fan 10 is set based on the rotation speed required for reducing the inverter temperature to be equal to or less than the threshold, the rotation speed being acquired beforehand by an experiment or the like, as with Step S114.

In Step S116, the control unit 5 drives the radiator fan 10 based on the set rotation speed of the radiator fan 10.

On the other hand, in Step S121, when it is determined that the inverter temperature acquired in Step S110 is equal to or less than the predetermined threshold $T_2$, the control unit 5 carries out processing of Step S131 in order to determine the motor temperature.

In Step S131, the control unit 5 determines whether the motor temperature acquired in Step S110 is higher than a predetermined threshold $T_3$. The threshold $T_3$ is determined beforehand by an experiment or the like and set as a temperature not affecting an operation of the motor 3. When the motor temperature is higher than the threshold $T_3$, the control unit 5 carries out processing of Step S132 in order to set the rotation speed of the radiator fan 10 to a rotation speed required for reducing the motor temperature to be equal to or less than the threshold $T_3$. On the other hand, when it is determined that the motor temperature acquired in Step S110 is equal to or less than the predetermined threshold $T_3$, the control unit 5 carries out processing of Step S141, and then stops the radiator fan 10 or does not drive the radiator fan 10.

In Step S132, the control unit 5 sets a rotation speed rpm3 of the radiator fan 10 according to the motor temperature acquired in Step S110. Then, the control unit 5 carries out processing of Step S116 in order to drive the radiator fan 10 based on the set rotation speed rpm3. The rotation speed rpm3 of the radiator fan 10 is set based on the rotation speed required for reducing the motor temperature to be equal to or less than the threshold, the rotation speed being acquired beforehand by an experiment or the like.

In Step S116, the control unit 5 drives the radiator fan 10 based on the set rotation speed of the radiator fan 10. Thus, the radiator 1 is cooled, so that the cooling water flowing through the cooling water path 21 is cooled and the casing 23 of the inverter 2 and the case 31 of the motor 3 are directly cooled by the airflow of the radiator fan 10.

The cooling system for the inverter 2 of the first embodiment described above can obtain the following effects.

The casing 23 of the inverter 2 is formed of non-metallic materials, such as a resin, and includes the base portion 24 where the plurality of electric components 22 is placed and the cover portion 25 formed of metallic materials, such as aluminum, fixed to the base portion 24, and covering the periphery of the plurality of electric components 22. The base portion 24 is formed of non-metallic materials, such as a resin, and therefore the inverter 2 can be reduced in weight. Moreover, the cooling water path 21 formed in the base portion 24 can be formed of a resin, and therefore processing is facilitated as compared with a case where the cooling water path is formed of a metal and a cooling water path of a complicated-shape can be created without additional processing. The casing 23 is disposed at the position where the airflow from the radiator fan 10 is applied to the cover portion 25. Hence, the cover portion 25 can be cooled even when the cooling effect obtained by the cooling water path 21 is not transferred to the cover portion 25. Thus, the cover portion 25 of the casing 23 can be cooled even when the cooling water path 21 is formed of a resin having heat resistance higher than that of a metal, and therefore the cooling system for the inverter 2 which enables sufficient cooling, is easy to process, and is reduced in weight can be provided.

Next, in the casing 23 of the inverter 2, the tip surfaces of the side wall 252 of the cover portion 25 are fastened to the motor 3. Therefore, the strength of the casing 23 can be secured while forming the base portion 24 of non-metallic materials, such as a resin. The casing 23 is disposed at the position where the airflow from the radiator fan 10 is applied to the cover portion 25, so that the casing 23 is cooled by the airflow of the radiator fan 10. Therefore, it can be suppressed that the inside of the casing 23 is heated by the heat of the motor 3 transferred to the cover portion 25. Hence, the cooling system for the inverter 2 which enables sufficient cooling while securing strength, is easy to process, and is reduced in weight can be provided.

The casing 23 of the inverter 2 is provided with the heat sink 26 (heat sink structure) on the outer surface of the cover portion 25. Therefore, the casing 23 can be efficiently cooled by the airflow of the radiator fan 10. Hence, even when the generation of heat of high temperature components, such as the motor 3, to which the side wall 252 of the cover portion 25 is fastened is larger, the base portion 24 can be formed of non-metallic materials, such as a resin, so that a weight reduction can be achieved.

The heat sink 26 on the outer surface of the cover portion 25 of the casing 23 is the radiating fin 261 projecting from the cover portion 25 to the outside of the casing 23. Therefore, the casing 23 can be more efficiently cooled by the airflow of the radiator fan 10.

The casing 23 of the inverter 2 is installed to face the radiator 1. On the side wall 252b on the side opposite to the side wall 252a facing the radiator 1 of the cover portion 25 of the casing 23, the heat sink 26 is not provided. Thus, the casing 23 can be efficiently cooled by a smaller number of components and the inverter 2 can be reduced in space.

When the temperature of the cooling water is higher than the predetermined temperature, the cooling system for the inverter 2 drives the radiator fan 10 at the rotation speed according to the temperature of the cooling water. Thus, the temperature of the cooling water can be efficiently reduced.

When the temperature of the inverter 2 is higher than the predetermined temperature even in a case where the temperature of the cooling water is equal to or less than the predetermined temperature, the cooling system for the inverter 2 drives the radiator fan 10 at the rotation speed according to the temperature of the inverter 2. Thus, even when the temperature of the inverter 2 is increased by the heat transfer by the cover portion 25 of the casing 23 fastened to the high temperature components, such as the motor 3, in a case where the cooling water temperature does not increase, the casing 23 can be cooled by driving the radiator fan 10.

When the temperature of the motor 3 is higher than the predetermined temperature even in a case where the temperature of the cooling water and the temperature of the inverter 2 are equal to or less than the predetermined temperatures, the cooling system for the inverter 2 drives the radiator fan 10 at the rotation speed according to the temperature of the motor 3. Thus, when the temperature of the motor 3 increases in a case where the cooling water temperature and the temperature of the inverter 2 do not increase, it can be suppressed that the heat of the motor 3 is transferred to the cover portion 25 of the casing 23 fastened to the case 31 of the motor 3, so that the temperature of the inverter 2 increases.

Although the cooling water temperature of the back side of the portion where the electric components 22 are placed of the base portion 24, the temperature in the casing 23 of the inverter 2, and the temperature of the rotor or the stator of the motor 3 are acquired as the cooling water temperature, the inverter temperature, and the motor temperature, respectively, the installation places of the temperature acquisition means are not necessarily limited thereto.

The structure in which the outlet and the inlet of the cooling water path 21 are coupled by the cooling water passage 4, so that the cooling water is circulated is adopted. However, the present invention is not necessarily limited thereto and may adopt a structure in which the cooling water is introduced from the outside of the cooling system to cool the motor 3 and the inverter 2, and then the cooling water is discharged to the outside of the cooling system.

Modification of First Embodiment

A cooling system for a power conversion device according to a modification of the first embodiment is described with reference to FIG. 5.

Figure 5:
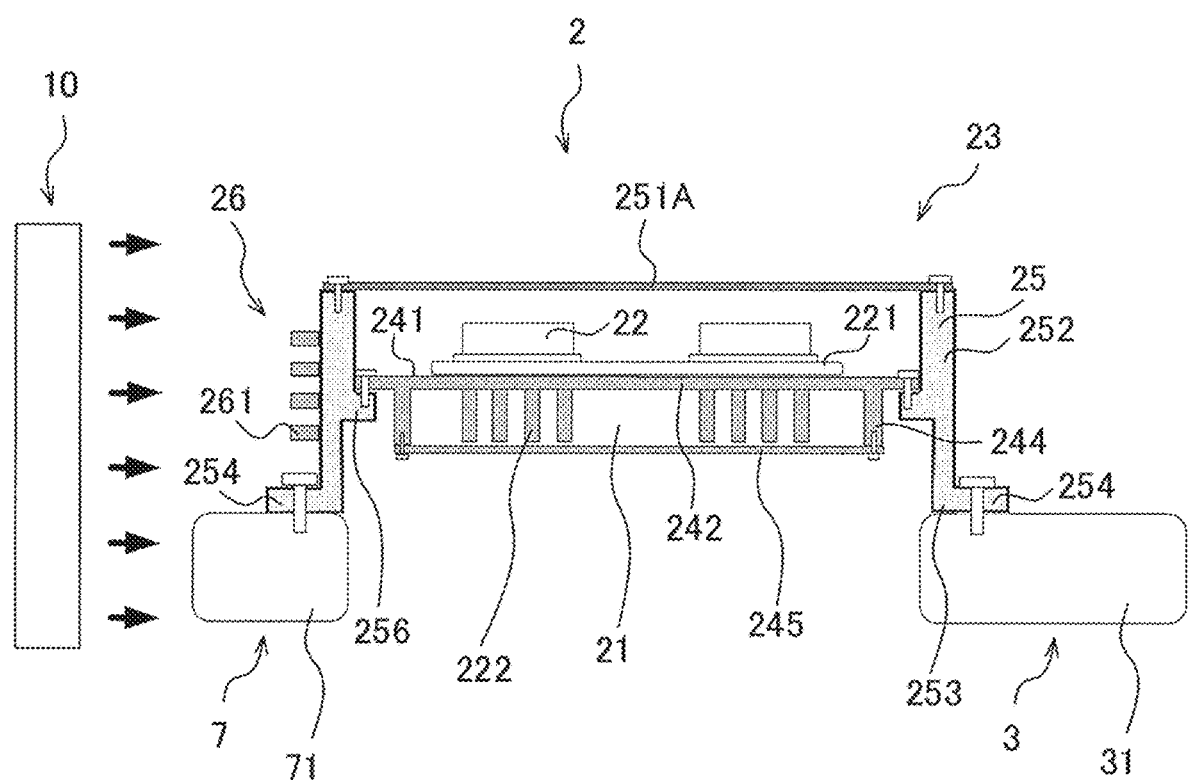
FIG. 5 is a cross-sectional view of a power conversion device according to a modification of the first embodiment.

FIG. 5 is a schematic block diagram illustrating the cooling system for the power conversion device according to the modification of the first embodiment. This modification is different from the first embodiment in that the upper wall of the cover portion 25 of the casing 23 is a thin plate-like metal lid 251A and that the cover portion 25 is fastened to a plurality of components and in a fastening method of the base portion 24 of the casing 23 and the cover portion 25. This modification gives a description while using the same reference numerals for configurations performing the same functions as those of the first embodiment and omitting duplicate descriptions as appropriate.

As illustrated in FIG. 5, the upper wall of the cover portion 25 is configured by the thin plate-like lid 251A containing a metal, such as aluminum. The outer peripheral edge of the metal lid 251A abuts on the upper end surface of the side wall 252 of the cover portion 25. The metal lid 251A and the side wall 252 of the cover portion 25 are fastened to each other by bolts or the like in the abutment portion. By configuring the upper wall of the cover portion 25 by the thin plate-like metal lid 251A, the casing 23 can be further reduced in weight.

The side wall 252 of the cover portion 25 is provided with a projection portion 256 projecting inside and the outer edge portions 254 of a flange shape the bottom surfaces (tip surfaces of the side wall 252) of which abut on the case 31 of the motor 3 and a case 71 of a decelerator 7. The bottom surfaces (tip surfaces of the side wall 252) of the outer edge portions 254 and the case 31 of the motor 3, and the bottom surfaces (tip surfaces of the side wall 252) of the outer edge portions 254 and the case 71 of the decelerator 7 are fastened to each other by bolts or the like from the upper side of the outer edge portions 254.

In the projection portion 256 of the cover portion 25, the upper surface abuts on the bottom surface of the outer edge portion 243 of the base portion 24. The cover portion 25 and the base portion 24 are fastened to each other by bolts or the like from the upper side of the base portion 24 in the abutment portion.

On the side wall 252 of the cover portion 25, the heat sink 26 including the plurality of radiating fins 261 is projectingly provided at a position where the airflow of the radiator fan 10 is applied. The radiating fins 261 are provided in a rib shape to project from the cover portion 25 to the outside of the casing 23.

Also the cooling system for the inverter 2 according to the modification of the first embodiment can obtain the same effects as those of the first embodiment.

Also in both the embodiments, the installation direction of the casing 23 of the inverter 2 can be arbitrarily determined insofar as the casing 23 of the inverter 2 is installed at the position where the airflow of the radiator fan 10 is applied. For example, the casing 23 of the inverter 2 may be installed in a state where FIG. 1 or FIG. 5 is inverted upside down such that the base portion 24 is positioned upside and the cover portion 25 is positioned downside or may be installed in a state where the casing 23 of the inverter 2 is tilted.

Both the embodiments are configured so that the casing 23 of the inverter 2 is cooled using the airflow of the radiator fan 10 supplying air to the radiator 1 cooling the cooling water flowing through the cooling water path 21. However, the present invention is not necessarily limited thereto and may adopt a configuration in which the casing 23 of the inverter 2 is cooled using an airflow of a radiator fan supplying air to a radiator cooling cooling water for cooling other components in a vehicle, for example.

The casing 23 of the inverter 2 is fastened to an upper portion of the motor 3 in the first embodiment and is fastened to upper portions of the motor 3 and the decelerator 7 in the modification of the first embodiment. However, the installation position of the inverter 2 is not limited thereto and the inverter 2 may be disposed on the front end of the motor 3, for example.

The heat sink 26 is preferably installed on the cover portion 25 for an improvement of the cooling efficiency. However, the present invention is not necessarily limited thereto and the heat sink 26 may not be provided.

The component to which the cover portion 25 is fastened is the motor 3 in the first embodiment and the components are the motor 3 and the decelerator 7 in the modification of the first embodiment. However, the type of the component is not limited thereto insofar as the component has rigidity higher than that of the base portion 24 formed of a resin or the like. The number of the components to which the cover portion 25 is fastened is also not limited thereto. For example, the cover portion 25 may be fastened to three or more components.

In both the embodiments, the cooling water is used as the refrigerant flowing through the cooling water passage 4 and the cooling water path 21. However, the refrigerant is not limited thereto and may be a refrigerant gas, for example.

As described above, the embodiments of the present invention are described. However, the embodiments merely exemplify some of application examples of the present invention and do not intend to limit the technical scope of the present invention to the specific configurations of the embodiments described above.

The embodiments described above each are described as an independent embodiment but may be combined as appropriate.

The invention claimed is:

1. A cooling system comprising:
a radiator;
a radiator fan supplying air to the radiator;
a case; and
a power conversion device including:
  a plurality of electric components and
  a casing in which the plurality of electric components is housed, wherein:

the casing includes:
- a base portion which is formed of a non-metallic material and on which the plurality of electric components is placed and
- a cover portion formed of a metallic material, fixed to the base portion and fixed to the case, and covering a periphery of the plurality of electric components, a refrigerant channel through which a refrigerant cooling the plurality of electric components flows is formed in the base portion of the casing, and the casing is disposed at a position where an airflow of the radiator fan is applied to the cover portion.

2. The cooling system according to claim 1, wherein:
the power conversion device is mounted in a vehicle, and
the cover portion of the casing is fastened to a component having rigidity higher than rigidity of the base portion.

3. The cooling system according to claim 1, wherein:
the casing includes a heat sink structure on an outer surface of the cover portion.

4. The cooling system according to claim 3, wherein:
the casing is installed to face the radiator, and
the heat sink structure is not provided on a first side wall on a side opposite to a second side wall facing the radiator of the cover portion of the casing.

5. The cooling system according to claim 3, wherein:
the heat sink structure is a fin projecting from the cover portion to an outside of the casing.

6. The cooling system according to claim 1, further comprising:
a control unit controlling an operation of the radiator fan, wherein
when a temperature of the refrigerant flowing through an inside of the refrigerant channel is higher than a first predetermined temperature, the control unit drives the radiator fan at a rotation speed according to the temperature of the refrigerant.

7. The cooling system according to claim 6, wherein:
when a temperature of the power conversion device is higher than a second predetermined temperature even in a case where the temperature of the refrigerant is equal to or less than the first predetermined temperature, the control unit drives the radiator fan at a rotation speed according to the temperature of the power conversion device.

8. The cooling system according to claim 7, further comprising:
a rotary electric machine electrically connected to the power conversion device, wherein:
when a temperature of the rotary electric machine is higher than a third predetermined temperature even in a case where the temperature of the refrigerant is equal to or less than the first predetermined temperature and the temperature of the power conversion device is equal to or less than the second predetermined temperature, the control unit drives the radiator fan at a rotation speed according to the temperature of the rotary electric machine.

* * * * *